United States Patent [19]

Olsen et al.

[11] 4,006,403
[45] Feb. 1, 1977

[54] ENGINE PERFORMANCE ANALYZER

[75] Inventors: Dick Merlin Olsen, Pasadena; Charles H. Armstrong; Gordon L. Brock, both of Huntington Beach, all of Calif.

[73] Assignee: Clayton Manufacturing Company, El Monte, Calif.

[22] Filed: Apr. 11, 1975

[21] Appl. No.: 567,395

[52] U.S. Cl. .............................. 324/15; 324/16 R; 73/116
[51] Int. Cl.² ....................................... G01M 15/00
[58] Field of Search .......................... 324/15, 16 R; 73/116–118

[56] References Cited
UNITED STATES PATENTS

| | | | |
|---|---|---|---|
| 3,551,800 | 12/1970 | Widmer | 324/15 |
| 3,572,103 | 3/1971 | Marino | 73/116 |
| 3,665,294 | 5/1972 | Pelta et al. | 324/16 |
| 3,788,129 | 1/1974 | Trussell | 73/116 |

*Primary Examiner*—R. V. Rolinec
*Assistant Examiner*—Vincent J. Sunderdick
*Attorney, Agent, or Firm*—Jackson & Jones

[57] ABSTRACT

An internal combustion engine performance analyzer is described for providing a numerical value representing certain operating characteristics such as spark plug ionization voltage, points closed voltage drop, alternator ripple output voltage and voltage drop across the starter during cranking. Simple connections to the engine provide the necessary signals to the solid state electronic analyzer. The analyzer includes appropriate switches, converters and a cylinder identification circuit in the form of a ring counter for enabling the several parameters to be conveniently measured and displayed in a digital format.

28 Claims, 6 Drawing Figures

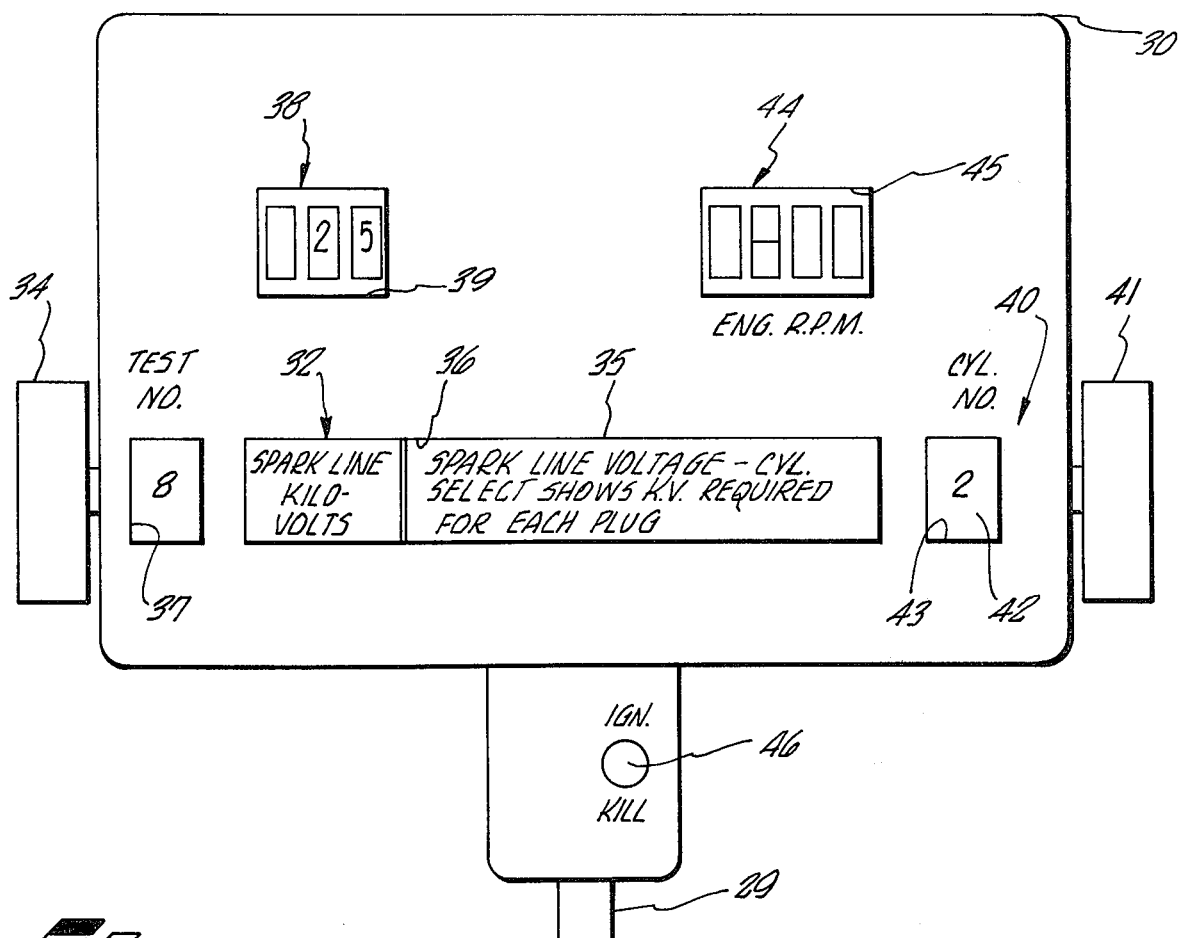
FIG_3_
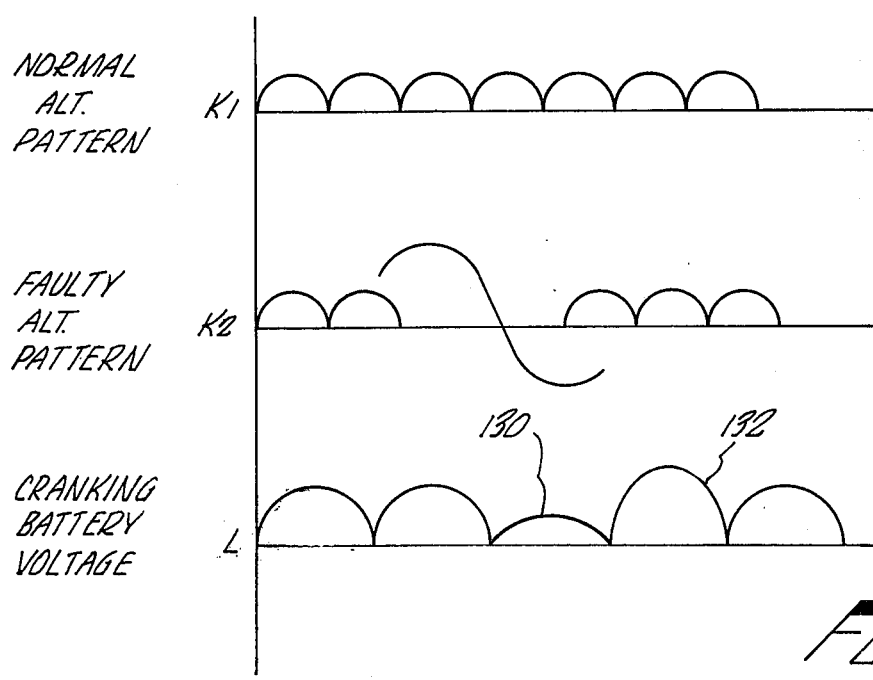
FIG_5_

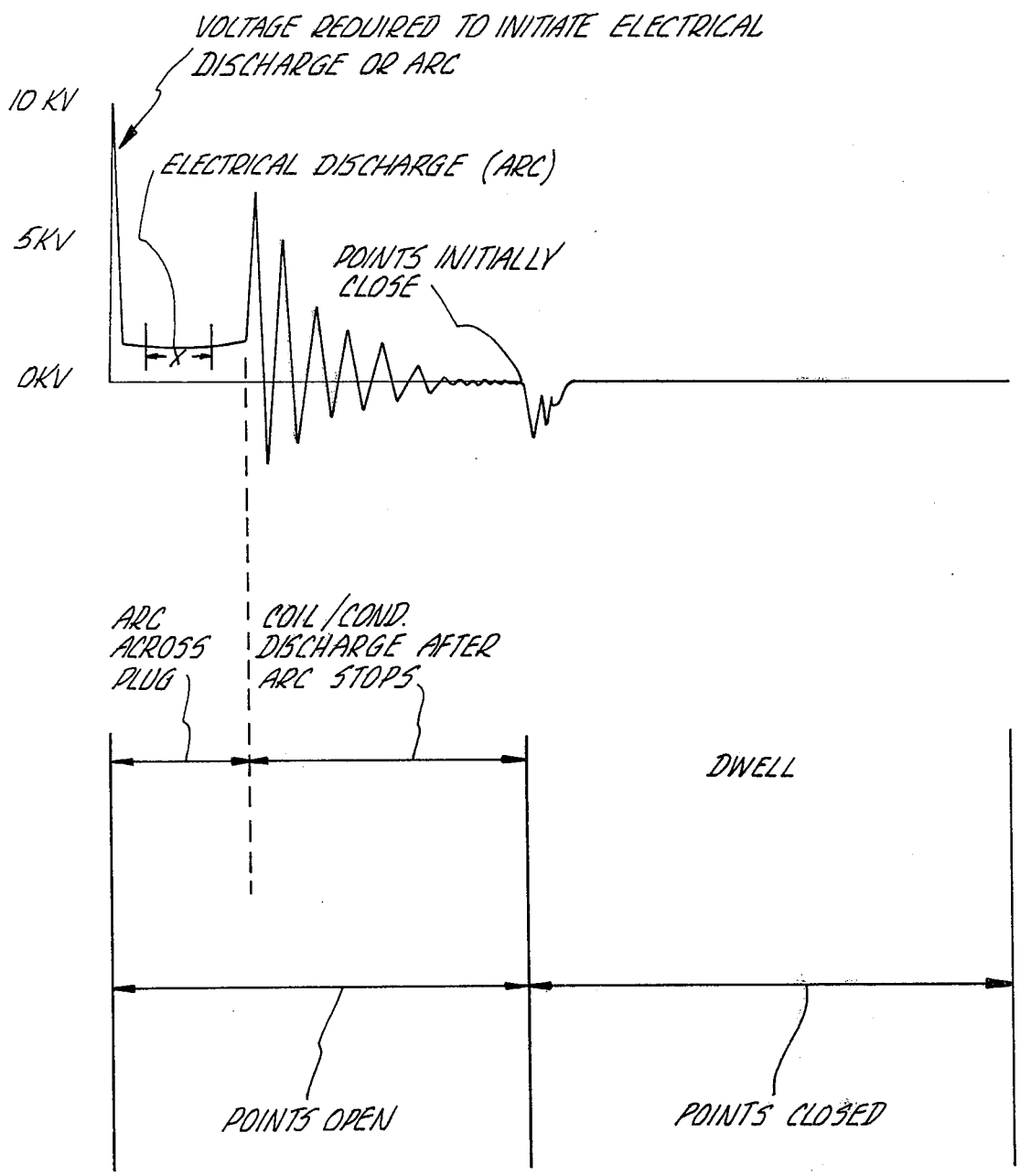

ENGINE PERFORMANCE ANALYZER

BACKGROUND OF THE INVENTION

1. Field of the Invention

This invention relates to a system for analyzing internal combustion engines and more particularly to an electronic testing system for analyzing certain engine operating characteristics.

2. Description of the Prior Art

Various types of electronic analyzers have been proposed heretofore to indicate performance characteristics of internal combustion engines. Many of such systems display engine operating characteristics such as ignition voltages supplied to the igniters or spark plugs of the engine by means of cathode-ray tube oscilloscope. An oscilloscope display of ignition system characteristics such as ignition pulse waveforms provide a considerable amount of information concerning an engine's ignition system. However, such a display requires a highly skilled operator to analyze the information and determine engine defects. Furthermore, analyzers employing such display systems are relatively large because of the size of the cathode-ray tube and not too readily portable. The present invention overcomes certain of the shortcomings of such prior art analyzers.

SUMMARY OF THE INVENTION

The present invention provides an apparatus for analyzing the operation of a multiple cylinder internal combustion engine equipped, for example, with a source of d.c. voltage such as a battery, means for recharging the battery, such as an alternator, an igniter or spark plug for providing an electrical discharge in each cylinder, and an ignition system for supplying an ignition pulse to the igniters to cause the cylinders to fire in a given sequence. The ignition system further includes an energy storage element which may be in the form of an auto transformer type ignition coil with a primary winding connected between the battery and mechanical breaker points so that closure of the breaker points results in current flow through the primary winding of the ignition coil and the opening of the breaker points allows the energy stored in the ignition coil to discharge through the secondary winding and the spark plug connected thereto by means of a suitable distributor. The analyzer includes means responsive to the occurrence of each ignition pulse for producing a spark line gate signal during the time interval of the electrical discharge in each cylinder. Cylinder identification means which may be in the form of a ring counter is coupled to the ignition system and arranged to generate a separate cylinder identification signal which corresponds to the time interval of the compression stroke and ignition (electrical discharge) in each individual cylinder. Means are further provided responsive to the occurrence of the spark line gate signal and a selected cylinder identification signal; for example, the signal representing cylinder No. 2 for providing a numerical value of the voltage supplied to the respective igniter during a predetermined portion of the time interval of the electrical discharge in the selected cylinder.

The analyzer may further include means coupled to the engine ignition system and responsive to the closure of the breaker points for generating a points closed sample signal. Means are coupled to the breaker points and responsive to the points closed sample signal for providing a numerical measure of the average voltage drop across the points during a predetermined portion of the time interval that the points are closed.

The analyzer may further include means coupled to the alternator for providing a numerical measure of the amplitude of the a.c. ripple voltage in the output of the alternator. The analyzer may also include means coupled to the battery terminal for providing a numerical display of the voltage supplied to the engine's starter during the time the starter is turning the engine over without ignition for a check of the compression present in individual cylinders.

BRIEF DESCRIPTION OF THE DRAWINGS

FIG. 3 is a plan view of a hand held housing unit for holding certain of the circuit components of FIG. 1;

FIG. 5 is an enlarged view of waveform A of FIG. 4; and

FIG. 6 is a waveform diagram illustrating (a) the output voltage of a normal and faulty alternator with engine running, and (b) the battery terminal voltage of an engine during the cranking test.

DESCRIPTION OF THE PREFERRED EMBODIMENT

Figure 1:
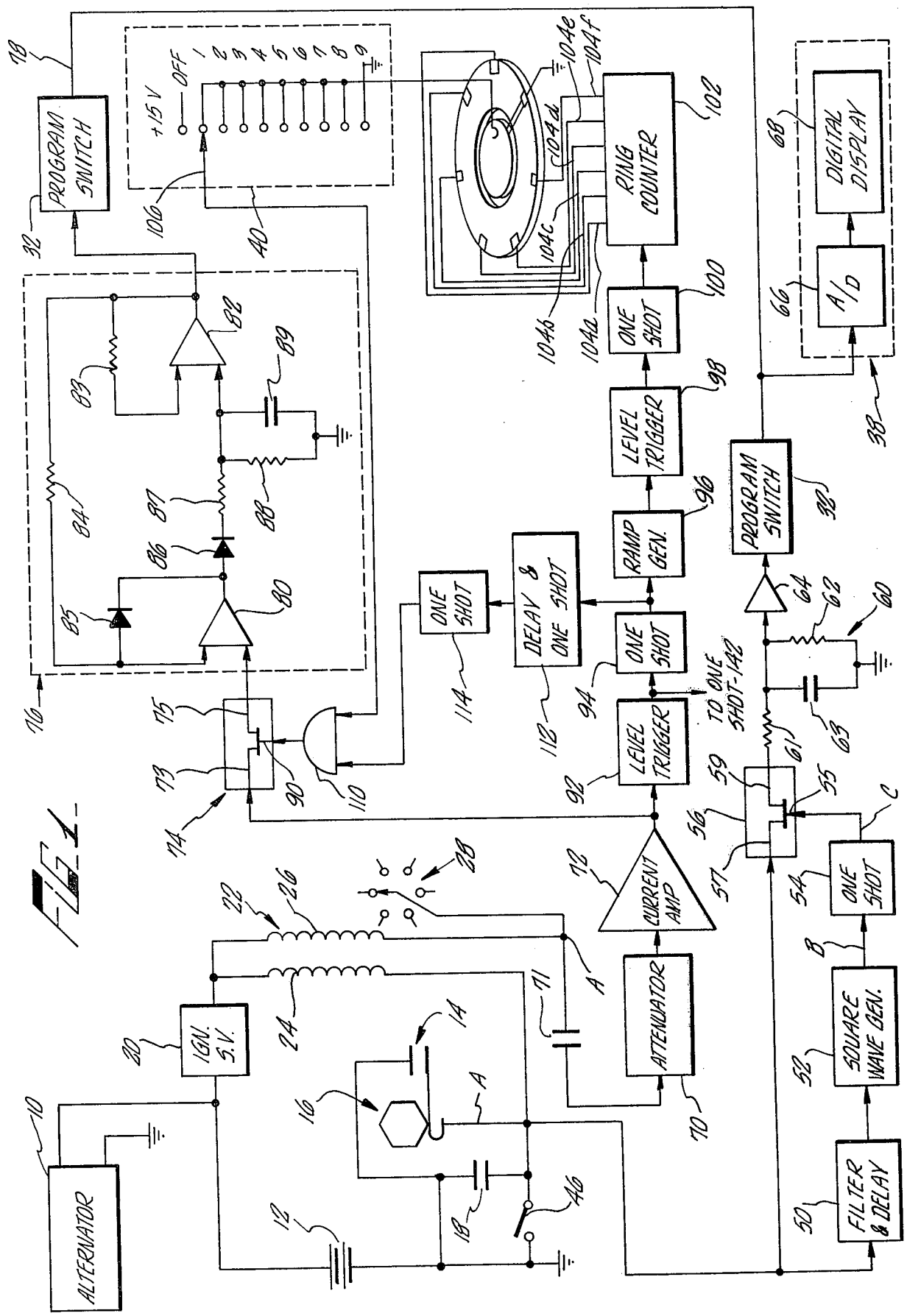
FIG. 1 is a block diagram of certain components of an electronic analyzer constructed in accordance with the present invention.

Referring now to FIG. 1, a conventional alternator 10 and a battery 12 are illustrated as a part of the engine undergoing a test by the apparatus of the present invention. The engine further includes an ignition system comprising breaker points 14 and a cam 16 for opening and closing the points in timed sequence with engine revolutions. A conventional ignition capacitor 18 is connected across the breaker points 14. An ignition coil 22 is illustrated with its primary winding 24 connected at one end to the battery terminal 12 by means of an ignition switch 20. The other end of the primary winding 24 is connected to the breaker points as illustrated. The ignition coil includes a secondary winding 26 connected to the rotating contact of a conventional distributor 28 for applying the ignition pulses to the igniters or spark plugs of the engine to cause the cylinders to fire in a given sequence.

The ignition coil 22 functions as an energy storage element by storing energy when the breaker points 14 are closed and provides a high voltage discharge to the appropriate spark plug when the points are opened.

The apparatus of the present invention is arranged to analyze certain characteristics of an internal combustion engine, e.g., (1) voltage drop across the points when closed for indicating the conditions of the points (pitted, etc.); (2) spark line voltage or voltage supplied by the distributor during discharge across the spark plug gap for indicating the resistance in the spark plug, and the spark plug wires; (3) alternator output voltage for indicating the condition of the alternator; and (4) battery terminal voltage during cranking to provide an indication of the compression present in the individual cylinders. While the measurement of only certain parameters is discussed in connection with the engine analyzer of FIGS. 1, 2, and 3, it should be noted that an engine analyzer would normally include additional circuitry for measuring other parameters such as distributor dwell, ignition timing, spark plug ionization voltage, etc. Measurement of such additional parameters is, for example, discussed in the U.S. Pat. No. 3,650,149.

PORTABLE HOUSING AND MANUAL CONTROLS FOR ANALYZER

The analyzer of the present invention includes a hand held housing unit 30 shown in FIG. 3 which is normally held by the operator while he sits in the automobile under test to control the throttle. The hand held unit is connected to the main electronic chassis which houses most of the components (shown in FIGS. 1 and 2) by means of a suitable multiconductor cable 29.

A program switch 32 for permitting manual selection of the test to be performed is operated by means of a manual knob 34. The program switch 32 may be in the form of a multiple position rotary switch having one or more stationary contact discs carrying fixed contacts associated with each switch position and a rotatable shaft which carries a moveable contact for each stationary contact disc. A suitable type of multiple position rotary switch is illustrated in FIG. 5 of U.S. Pat. No. 3,789,658.

The program switch 32 is also provided with a drum 35 which rotates with the rotary contact and carries a legend thereon individually associated with each switch position. The legend associated with the position to which the switch has been rotated is visible through a window 36 in the housing 30.

The drum 35 also carries a number associated with each switch position which number is visible through a window 37 in the housing to inform the operator of the test being conducted. In the position shown in FIG. 3 the program switch is rotated to test position number 8 for measuring the spark line voltage. The numerical value of the parameter being measured is displayed by a digital voltmeter 38 through a window 39 in the housing 30.

The housing 30 also carries a cylinder select switch 40 to be described in more detail in reference to FIG. 1. The cylinder select switch 40 includes a hand operated knob 41 which permits the operator to measure parameters such as spark line voltage associated with each individual cylinder as will be explained in more detail. The cylinder select switch 40 may also include a drum 42 which is rotatable with a rotating contact thereof. The drum 42 carries indicia visible through a window 43 for indicating which cylinder has been selected. If desired, such indicia would be engraved on the knob 41.

A second digital voltmeter 44 is provided for indicating the revolutions per minute of the engine under test via a window 45. A manual switch 46 is also included for shorting out the points when manually depressed to permit the cranking voltage to be measured without engine ignition as will be described later.

CIRCUIT FOR MEASURING THE POINTS CLOSED VOLTAGE DROP

Referring now to FIG. 1, the circuit for measuring the voltage drop across the ignition points while the points are closed includes a filter and delay circuit 50 connected to the undergrounded side of the points as illustrated. The circuit 50 filters the signal present across the points and delays the signal by an appropriate time period, for example, 5–10 microseconds (usec). The voltage across the points is illustrated by waveform A in FIG. 4. The output signal from the filter and delay circuit 50 is squared by a square wave generator 52 to provide the output signal illustrated by the waveform B in FIG. 4. The output signal from the square wave generator 52 triggers a one-shot multivibrator 54 to provide an output pulse as illustrated by the waveform C in FIG. 4 having a predetermined time duration, for example, 200 microseconds. The output pulse from the one-shot multivibrator 54 is applied to a control electrode 55 of a switch 56 which is illustrated as employing a field effect transistor (FET). The switch 56 is arranged to connect the source electrode 57 to the drain electrode 59 thereof for the duration of pulse C.

The voltage across the points is applied to an integrating circuit 60 when the switch 56 is closed, e.g., for the duration of pulse C. The integrating circuit 60 includes a series resistor 61 and a resistor 62 and a capacitor 63 connected in parallel to ground as illustrated to provide an input signal to an amplifier 64 which represents the integrated voltage across the points in the closed condition for the duration of the pulse C. The output signal from the amplifier 64 is applied as one input to the program switch 32.

When the program switch 32 is rotated to the appropriate position for measuring the points closed voltage drop, the output signal from the amplifier 64 is coupled to a digital voltmeter 38 which includes an analog to digital converter 66 and a digital display unit 68 as illustrated. Thus, a digital display of the voltage across the points in the closed condition is provided by the display unit 68. An excessive voltage drop across the points in their closed condition is an indication that the contacts are not making good contact due to pitting, improper point adjustment, etc.

CIRCUIT FOR MEASURING SPARK LINE VOLTAGE

Referring again to FIG. 1, the circuit for measuring the spark line voltage or the voltage required to sustain an arc across the spark plug gap includes an attenuator circuit 70 which has an input connected to the output terminal of the secondary ignition coil winding 26 by means of an appropriate probe including a capacitor 71. The output signal from the attenuator circuit 70 is amplified and inverted by a current amplifier 72 and applied to the source electrode 73 of an FET switch 74. The drain electrode 75 of the switch 74 is connected to a peak voltage measuring circuit 76. The program switch 32 connects the output signal from the circuit 76 to the input of the digital voltmeter 38 via lead 78 when the program switch 32 is rotated to the appropriate position, that is, the position for measuring the spark line voltage.

The peak voltage measuring circuit 76 includes a pair of operational amplifiers 80 and 82, a pair of feedback resistors 83 and 84, a pair of diodes 85 and 86 and an integrating circuit including resistors 87 and 88 and a capacitor 89 connected as shown. The circuit 76 provides an output signal having an amplitude which represents the peak value of the input voltage.

The switch 74 includes a control electrode 90 and is arranged to connect the source and drain electrodes thereof when a high level signal is applied to the control electrode. A high level signal is applied to the control electrode of switch 74 for a predetermined period of time during the time that an arc is sustained across the spark plug gap, for example, on the order of 300 microseconds. The circuit for generating this control signal will now be described.

The output signal from the current amplifier 72 actuates a level trigger 92 when the output voltage from the secondary coil 26 has exceeded a predetermined value, for example, 4 kilovolts. The level trigger 92, when actuated, provides an output signal which is applied to a one-shot multivibrator 94. The output signal from the one-shot multivibrator 94 triggers a ramp generator 96 which provides a sawtooth output signal of constant maximum amplitude illustrated by the waveform E in FIG. 4. The sawtooth output signal from the ramp generator 96 actuates a level trigger circuit 98 when the amplitude of the ramp reaches a predetermined level. Since the ramp generator 96 is synchronized with the engine and provides a constant maximum amplitude, a given amplitude corresponds to a predetermined number of degrees of engine rotation preceding the next ignition pulse. Thus, the level trigger 98 generates a signal which anticipates the cylinder fire by a predetermined number of degrees of engine rotation.

The ramp generator 96 and level trigger 98 may be of the type described in U.S. Pat. No. 3,650,149 as the servo sweep generator 37 and level trigger 71 in FIG. 1 B.

Figure 4:
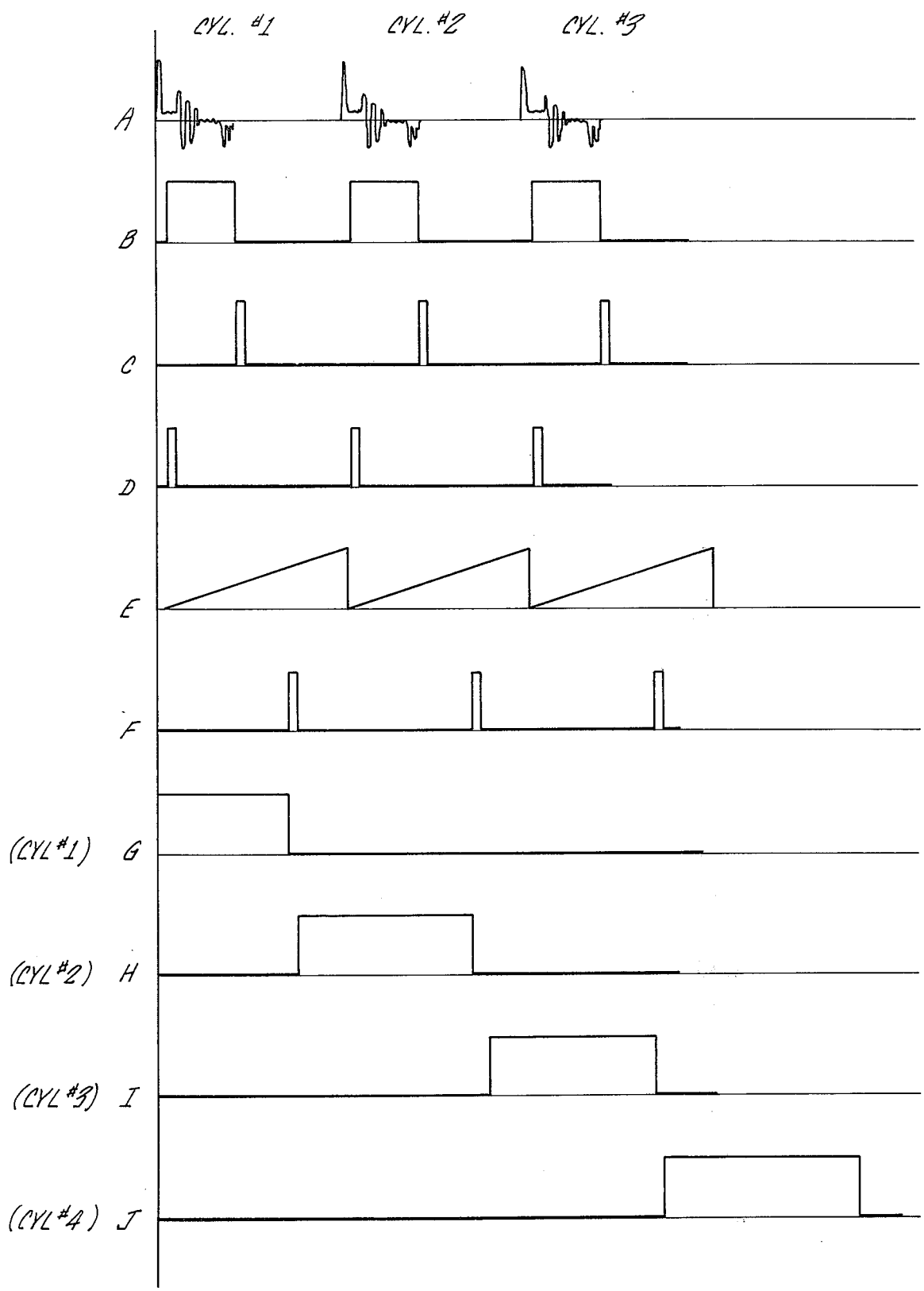
FIG. 4 is a waveform timing diagram illustrating the signals present on various leads in the circuit of FIGS. 1 and 2.

The output signal from the level trigger 98 triggers a one-shot multivibrator 100 which provides an output pulse represented by waveform F in FIG. 4. This output signal from the one-shot multivibrator 100 is applied as an input signal to a cylinder identification means in the form of a ring counter 102 of the type described in detail in U.S. Pat. No. 3,650,149. Each input pulse to the ring counter 102 shifts the counter and steps the output signal thereof from one of it stages, 104a, 104b, 104c, 104d, 104e or 104f to the following stage. The output signals from the ring counter 102 correspond with the firing times of individual cylinders with the signal in the output circuit 104 braketing the firing time of cylinder No. 1, etc. The counter 102 provides the output signals G, H, I and J illustrated in FIG. 4 in output stages 104a, 104b, 104c and 104d to correspond with the firing times of cylinders in firing order of No. 1, No. 2, No. 3 and No. 4, respectively. The output signals in the last two output stages, 104e and 104f, are not shown in FIG. 4 but are identical in form to the output signals G, H, etc., and displaced in time to correspond to the firing times of cylinders No. 5 and No. 6.

The ring counter 102 is illustrated as having six output stages. It should be noted, however, that the number of output stages of the ring counter 102 must correspond to the number of cylinders of the engine under test, for example, 4, 6, 8, etc. The output stages of the ring counter 102 are connected to fixed contacts numbered 1-8 of the cylinder select switch 40. The rotating contact 106 of the cylinder select switch is connected to a selected fixed contact e.g. off, 1, 2, 3, etc., by rotating the knob 41. The rotating contact of the switch 40 is connected to the control electrode 90 of the switch 74 by means of an AND gate 110.

The AND gate 110 includes a second input which receives a pulse delayed in time (i.e. 100us) from the points opening phenomena to insure that the voltage applied to the spark plugs or ignitors has stabilized. This delay is provided by a delay and one-shot multivibrator circuit 112. The output signal from the circuit 112 is applied to the second input of the AND gate 110 via a one-shot multivibrator 114. The output signal from the one-shot multivibrator 114 is illustrated as waveform D in FIG. 4. This output signal represented by waveform D is delayed from the points opening by suitable time, i.e. 100 us, and has a predetermined time duration i.e. 300 us to permit the spark line voltage (voltage applied by the secondary coil to the spark plugs) to be sampled during a predetermined time interval as will be explained in more detail.

The output of the AND gate 110 is at a high level only when both input signals are at high levels. Thus, when the switch 40 is in the position shown; the AND gate 110 provides a high level signal to the control electrode of the switch 74 to cause the switch to provide a closed circuit between the source and drain electrodes ony upon the simultaneous occurrence of (a) the spark line gate signal D (FIG. 4) from the one-shot multivibrator 114 and (b) an output signal in the first output gate of the ring counter 102 corresponding to the firing time of cylinder No. 1. When the switch 40 is turned to the off position to thereby connect a positive 15 volt source to the AND gate 110 the switch 74 is enabled during each spark line gate signal from the one-shot multivibrator 114. When the switch 40 is turned to position No. 9, ground is connected to one input of the AND gate 110 to thereby provide a low level output voltage from the gate 110 which maintains the switch 74 in its open state.

Referring now to FIg. 6, an expanded view of the ignition signal A (FIG. 4) is illustrated. The ignition signal applied to the spark plugs includes a high voltage spike, for example, of the order of 10 kilovolts which is required to ionize the gas in the cylinder. Once the gas is ionized the electrical discharge or arc is sustained for a portion of the time that the points are open as illustrated. The spark line gate signal which enabled the switch 74, FIG. 1, is delayed from the initiation of the ignition pulse (points opening) by a suitable amount, for example, 100 usec to insure that the electrical discharge has occurred. The spark line gate signal, as discussed previously, has a predetermined time duration of the order of 300 usec indicated by the letter X in FIG. 6. Thus, when the switch 74 is closed the spark line voltage is applied to the input of the peak voltage measuring circuit 76. The output signal from the circuit 76 is applied through the program switch 32 to the digital voltmeter 38. The digital voltmeter thus provides a numerical value of the peak voltage applied by the secondary ignition coil to the selected spark plug during a selected portion of the electrical discharge. The spark line voltage is normally in the range of 1.5 to 2.5 kilovolts with the voltages supplied to the individual plugs falling within a 500 volt range. An excessive spark line voltage indicates that the spark plug wires and/or spark plugs have an abnormally high series resistance or that the spark plugs are improperly gapped.

CIRCUIT FOR MEASURING THE COMPRESSION OF INDIVIDUAL CYLINDERS

Figure 2:
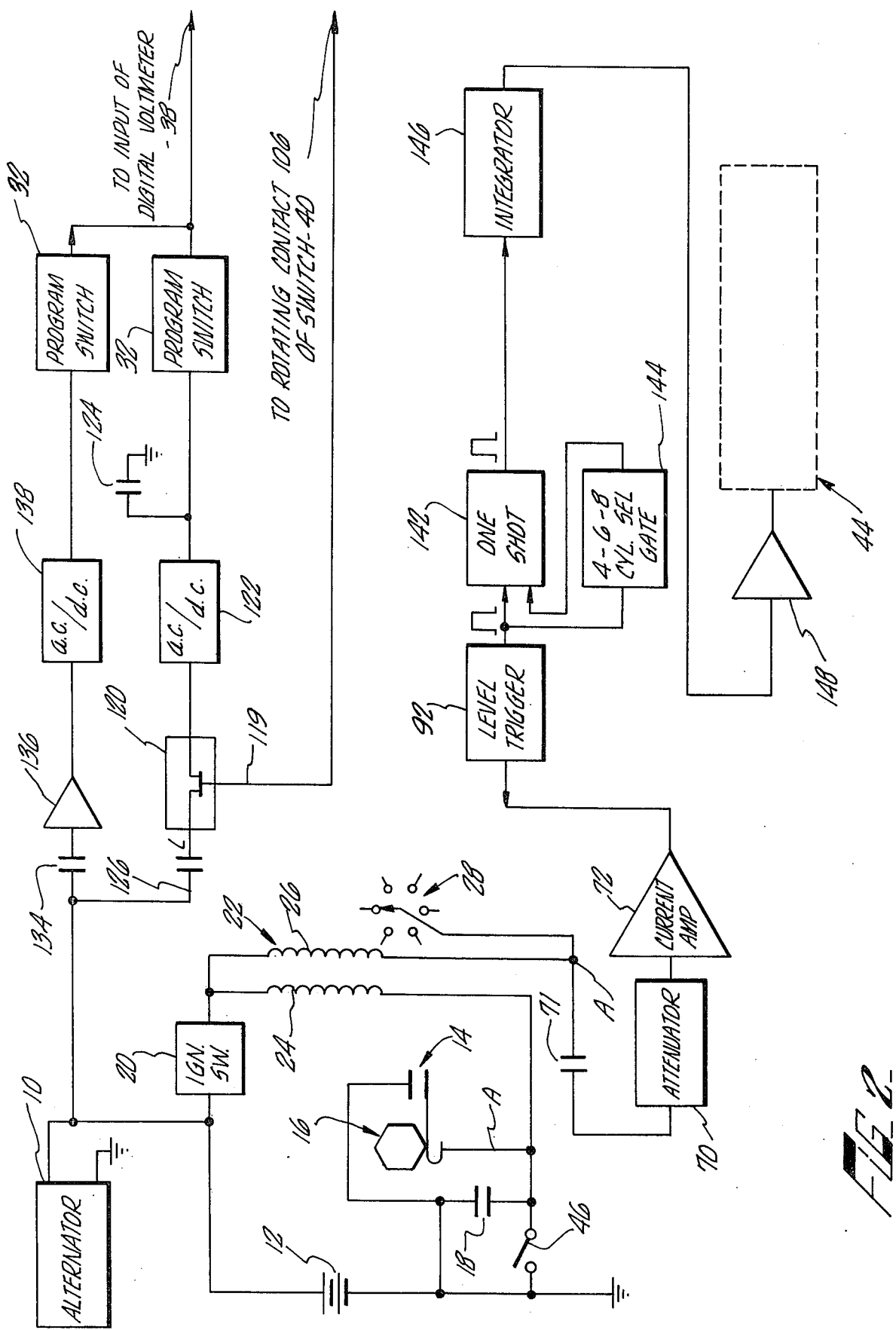
FIG. 2 is a block diagram of the remaining components of the engine analyzer of FIG. 1.

Referring now to FIG. 2, the compression of the individual cylinders may be measured by cranking the engine, that is, turning the engine over with the starter while preventing ignition. The cranking voltage fluctuations are measured by means of an FET switch 120, an a.c. to d.c. converter 122, an integrating capacitor 124 and a coupling capacitor 126. As is illustrated, the source electrode of the switch 120 is connected to the battery terminal by means of a suitable probe including the coupling capacitor 126. The switch 120 includes a control electrode 119 which is connected either to a selected output stage of the ring counter 102 or to the positive 15 volt source by means of the cylinder select switch 40. When the switch 40 is in the position shown a high level signal is applied to the control electrode 119 of the switch 120 each time the output stage of the ring counter 102 corresponding to the selected cylinder (e.g. No. 1) provides an output signal. When the cylinder select switch is rotated to position number 1 as shown, the output signal G (FIG. 4) is applied to the control electrode 119 so that the a.c. component of the battery terminal voltage present during the compression stroke of cylinder number 1 is applied by the switch 120 through the a.c. to d.c. converter to the integrating capacitor 124. The integrated voltage present on capacitor 124 is applied by the program switch 32 to the digital voltmeter 38. The voltmeter 38 provides a numerical value of the change in battery terminal voltage during the compression stroke of the selected cylinder.

Referring now to FIG. 5, the waveform L represents the a.c. component of the battery terminal voltage of the engine under test during cranking (without ignition) in which one cylinder has an abnormally low compression. The voltage change at the battery terminal due to current drain by the starter during the compression stroke of the cylinder with low compression is illustrated at 130 on waveform L. The voltage change at the battery terminal during the compression stroke of the next cylinder is represented at 132 on waveform L. As is apparent from waveform L the battery terminal voltage change is (1) small during the compression stroke of a cylinder with low compression and (2) large during the compression stroke of the succeeding cylinder. This large current drain represented by the curve 132 results from the fact that the low compression cylinder provides less torque to aid the starter in turning the engine over during the compression stroke of the succeeding cylinder than a cylinder having normal compression.

An average value of the changes in battery terminal voltage during the compression strokes of all of the cylinders may be obtained by turning the cylinder select switch to the OFF position to connect the 15 volt source to the control electrode 119 to thereby maintain the FET switch 120 closed. The average value may be read on the digital voltmeter 38. The digital values of the battery terminal voltage changes for each cylinder's compression stroke which may be compared with the average value to determine which cylinders, if any, have abnormally low compression.

CIRCUIT FOR MEASURING ALTERNATOR RIPPLE VOLTAGE

The circuit for measuring the alternator ripple voltage as shown in FIg. 2 includes the coupling capacitor 134, an amplifier 136 and an a.c. to d.c. converter 138. The alternator terminal voltages of a normal and faulty alternator illustrated by the waveform $K_1$ and $K_2$, respectively, in FIG. 5. An alternator functioning satisfactorily will provide a ripple voltage which appears as a full wave rectified sinusoidal wave. The waveform $K_2$ in FIG. 5 illustrates the output voltage of an alternator with an open diode. The alternator ripple voltage is converted to a digital value via the program switch 32 (when rotated to the proper test position) and the digital voltmeter 38. The value of the ripple voltage is indicative of the satisfactory or unsatisfactory performance of the engine's alternator. An alternator ripple voltage which is very small or zero is indicative of the fact that the alternator is not producing any field either due to faulty slip rings or an open field winding. A high reading of the alternator ripple voltage indicates that one or more of the diodes is shorted or that one or more diodes is open circuited or a combination of such factors.

CIRCUIT FOR PROVIDING A MEASURE OF ENGINE RPM

Referring again to FIG. 2, there is illustrated a circuit for providing a digital reading of engine rpm. The circuit includes a level trigger 92 having its input connected to the output of the amplifier 72 to receive as an input signal the attenuated ignition pulses applied to the spark plugs. The level trigger circuit 92 is arranged to provide a trigger pulse when the secondary voltage supplied to the spark plugs reaches a predetermined level, for example, 4 kilovolts. The level trigger circuit 92 is thus actuated by each ignition pulse. The output signal from the level trigger circuit 92 is applied to a one-shot multivibrator 142 and a 4, 6 or 8 cylinder selection gate 144. The gate 144 provides an outut pulse to an additional input of the one-shot multivibrator 142 which varies the on time of the multivibrator 142. When the gate 144 is manually set to represent a 4, 6 or 8 cylinder engine, the multivibrator 142 produces an output pulse of 1 millisecond, 1 ⅓ milliseconds and 2 milliseconds, respectively. The output pulses from the circuit 142 are integrated by means of integrator 146 and amplified by an amplifier 148. The integrated analog voltage output from the amplifier 148 representing engine rpm is applied to the second digital voltmeter 44. The reading provided by digital voltmeter 44 is a measure of the number of ignition pulses occurring during any given increment of time and this provides a measure of engine rpm.

There has been described an engine analyzer for providing digital readings of (a) the spark line voltage associated with each cylinder, (b) points closed voltage drop, (c) battery terminal voltage changes associated with each cylinder's compression stroke (without ignition) and (d) alternator ripple voltage. The analyzer may be used by relatively unskilled personnel since only digital readings need be compared and/or recorded. Various routine modifications of the described embodiment may be made without departing from the scope and spirit of the invention as set forth in the following claims.

What is claimed is:

1. In an apparatus for analyzing the operation of a multiple cylinder internal combustion engine having an igniter for providing an electrical discharge in each cylinder and an ignition system for supplying an ignition pulse to the igniter to cause the cylinders to fire in a given sequence, the combination which comprises:

means responsive to the occurrence of each ignition pulse for producing a spark line sampling signal for defining a sampling interval during the time interval of the sustained electrical discharge in each cylinder;

cylinder identification means coupled to the ignition system for generating a separate cylinder identification signal which corresponds with the time interval of the electrical discharge in each individual cylinder; and means activated upon concurrence of the spark line sampling signal and a selected cylinder identification signal for providing a measure of the voltage supplied to the igniter of the selected cylinder during said sampling interval.

2. The apparatus as defined in claim 1 wherein the last named means includes a peak value measuring circuit for obtaining the peak value of the voltage supplied to the igniter during said sampling interval.

3. The apparatus as defined in claim 2 wherein the last named means includes a digital voltmeter comprising an analog to digital converter and a digital display unit for providing a numerical reading of said peak value of the voltage supplied to the igniter.

4. The apparatus as defined in claim 3 wherein the last named means includes a switch being arranged to connect the input and output circuits thereof in response to the application of the cylinder identification signal and sampling signal to the control circuit of said switch, and means for coupling the cylinder identification signal corresponding to a selected cylinder to the control circuit of the switch and means for coupling the input and output circuits of the switch between the ignition system and the digital voltmeter.

5. The apparatus as defined in claim 1 including means responsive to the occurrence of each spark line sampling signal for providing a measure of the average voltage supplied to each of the ignitors.

6. The apparatus as defined in claim 5 wherein the last named means is a peak voltage measuring circuit for providing the average peak value of the voltage supplied to the ignitors.

7. The apparatus as defined in claim 6 wherein the peak voltage measuring circuit includes a digital voltmeter for providing a numerical display of the average peak voltage.

8. The apparatus as defined in claim 1 wherein the ignition system includes breaker points and wherein the spark line sampling signal is delayed form the time that the breaker points open by at least 50 microseconds.

9. The apparatus as defined in claim 8 wherein the spark line sampling signal has a time duration in excess of 200 microseconds.

10. The apparatus of claim 1 wherein the engine has a source of d.c. voltage and the ignition system includes an energy storage element and a breaker switch connected in series with the d.c. voltage source so that closure of the switch causes current flow through the storage element and opening of the switch allows the storage element to discharge current through an igniter, further including:
 switch closed sample signal generating means adapted to be coupled to the ignition system and responsive to the closure of the switch for generating a breaker switch closed sample signal delayed from the time that the breaker switch closes; and
 voltage measuring means adapted to be coupled to the breaker switch and responsive to the breaker closed sample signal for providing a measure of the average voltage across the breaker switch over a preselected time interval commencing after the breaker switch has closed.

11. The apparatus of claim 10 wherein the voltage measuring means is arranged to provide a numerical display of the voltage drop across the switch.

12. The apparatus of claim 11 wherein the switch closed sample signal generating means includes a one-shot multivibrator.

13. The apparatus of claim 11 wherein the switch closed sample signal generating means is arranged to produce a breaker switch closed sample signal having a time duration greater than 100 usec.

14. The apparatus of claim 10 wherein,
 the breaker switch comprises cam operated breaker points;
 the switch closed sample signal generating means is responsive to the points closing and arranged to produce a switch closed sample signal having said preselected time duration; and
 the voltage measuring means includes an analog to digital converter, a digital display unit and switching means, the switching means arranged to be connected in series with the analog to digital converter and the digital display unit for applying the voltage drop across the points to the analog to digital converter and display unit only for the duration of the switch closed sample.

15. The apparatus of claim 1 wherein the engine has an electrical starter and a source of d.c. voltage connected thereto for turning the engine over and wherein the cylinder identification means generates a separate cylinder identification signal which corresponds with the compression strokes and firing time intervals of each cylinder, the apparatus including:
 means for repressing the ignition in each of the cylinders; and
 cranking voltage measuring means adapted to be connected to the source of d.c. voltage for providing a numerical value of the change in voltage supplied to the starter during the compression stroke of a selected cylinder.

16. The apparatus of claim 15 wherein the cranking voltage measuring means is arranged to provide a numerical value of the average change in voltage supplied to the starter during the compression stroke of all cylinders.

17. The apparatus of claim 16 wherein the cranking voltage measuring means includes:
 a cranking voltage switch having an input and output and a control circuit and being arranged to connect the input and output in response to the application of a predetermined control signal to the control circuit thereof;
 means including a capacitor arranged to connect the input of the cranking voltage switch to the source of d.c. voltage;
 an a.c. to d.c. converter;
 an analog to digital converter;
 a digital display unit;
 means for connecting the a.c. to d.c. converter and the analog to digital converter in series relationship between the output of the cranking voltage switch and the digital display unit; and
 means for coupling a selected cylinder identification signal to the control circuit of the cranking voltage switch to enable the switch during the presence of the cylinder identification signal for a selected cylinder.

18. The apparatus of claim 1 wherein the engine has an alternator and including ripple voltage measuring means coupled to the alternator for providing a numerical value of the a.c. component of the alternator output voltage.

19. The combination of claim 18 wherein the alternator ripple voltage measuring means includes an a.c. to d.c. converter, an analog to digital converter and a digital display unit.

20. In an apparatus for analyzing the operation of a multiple cylinder internal combustion engine having a source of d.c. voltage and an ignition system comprising an energy storage element and a breaker switch connected in series with the d.c. voltage source so that closure of the switch causes current flow through the storage element and opening of the switch allows the storage element to discharge current through an igniter the combination which comprises:

switch closed sample signal generating means adapted to be coupled to the ignition system and responsive to the closure of the switch for generating a breaker switch closed sample signal delayed from the time that the breaker switch closes; and voltage measuring means adapted to be coupled to the breaker switch and responsive to the breaker closed sample signal for providing a measure of the average voltage across the breaker switch over a preselected time interval commencing after the breaker switch has closed.

21. The apparatus of claim 20 wherein the voltage measuring means is arranged to provide a numerical display of the voltage drop across the switch.

22. The apparatus of claim 21 wherein the switch closed sample signal generating means includes a one-shot multivibrator.

23. The apparatus of claim 21 wherein the switch closed sample signal generating means is arranged to produce a breaker switch closed sample signal having a time duration greater than 100 usec.

24. The apparatus of claim 20 wherein, the breaker switch comprises cam operated breaker points;

the switch closed sample signal generating means is responsive to the points closing and arranged to produce a switch closed sample signal having said preselected time duration; and the voltage measuring means includes an analog to digital converter, a digital display unit and switching means, the switching means arranged to be connected in series with the analog to digital converter and the digital display unit for applying the voltage drop across the points to the analog to digital converter and display unit only for the duration of the switch closed sample signal.

25. In an apparatus for analyzing the operation of an internal combustion engine wherein the engine has an electrical starter and a source of d.c. voltage connected thereto for turning the engine over, the combination which comprises:

cylinder identification means for generating a separate cylinder identification signal which corresponds with the compression strokes and firing time intervals of each cylinder;

means for repressing the ignition in each of the cylinders; and cranking voltage measuring means adapted to be connected to the source d.c. voltage for providing a numerical value of the change in voltage supplied to the starter during the compression stroke of a selected cylinder.

26. The apparatus of claim 25 wherein the cranking voltage measuring means is arranged to provide a numerical value of the average change in voltage supplied to the starter during the compression stroke of all cylinders.

27. The apparatus of claim 26 wherein the cranking voltage measuring means includes:

a cranking voltage switch having an input and output and a control circuit and being arranged to connect the input and output in response to the application of a predetermined control signal to the control circuit thereof;

means including a capacitor arranged to connect the input of the cranking voltage switch to the source of d.c. voltage;

an a.c. to d.c. converter;

an analog to digital converter;

a digital display unit;

means for connecting the a.c. to d.c. converter and the analog to digital converter in series relationship between the output of the cranking voltage switch and the digital display unit; and means for coupling a selected cylinder identification signal to the control circuit of the cranking voltage switch to enable the switch during the presence of the cylinder identification signal for a selected cylinder.

28. In an apparatus for analyzing the operation of a multiple cylinder internal combustion engine having an igniter for providing an electrical discharge in each cylinder and means for successively energizing said igniters, the combination comprising:

means for defining a sampling interval within the sustained arc portion of the electrical discharge in a selected cylinder;

means for sampling the voltage applied to the igniter of the selected cylinder during said sampling interval; and means for developing an analog voltage from the voltage sampled by said sampling means.

* * * * *